United States Patent
Murakami et al.

(10) Patent No.: US 12,488,991 B2
(45) Date of Patent: Dec. 2, 2025

(54) SUBSTRATE PROCESSING METHOD AND SUBSTRATE PROCESSING APPARATUS

(71) Applicant: Tokyo Electron Limited, Tokyo (JP)

(72) Inventors: Hiroki Murakami, Nirasaki (JP); Masanobu Matsunaga, Nirasaki (JP); Yamato Tonegawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 366 days.

(21) Appl. No.: 17/906,629

(22) PCT Filed: Mar. 17, 2021

(86) PCT No.: PCT/JP2021/010918
§ 371 (c)(1),
(2) Date: Sep. 19, 2022

(87) PCT Pub. No.: WO2021/193302
PCT Pub. Date: Sep. 30, 2021

(65) Prior Publication Data
US 2023/0146375 A1  May 11, 2023

(30) Foreign Application Priority Data
Mar. 24, 2020 (JP) .................. 2020-053329

(51) Int. Cl.
*H01L 21/311* (2006.01)
*H01J 37/32* (2006.01)
*H01L 21/02* (2006.01)

(52) U.S. Cl.
CPC .... *H01L 21/31116* (2013.01); *H01J 37/3244* (2013.01); *H01L 21/0217* (2013.01); *H01L 21/0228* (2013.01); *H01J 2237/334* (2013.01)

(58) Field of Classification Search
None
See application file for complete search history.

(56) References Cited

U.S. PATENT DOCUMENTS

| 6,576,151 B1 * | 6/2003 | Vereecke | H01L 21/31116 |
| | | | 257/E21.252 |
| 2005/0136583 A1 * | 6/2005 | Chen | H01L 21/823842 |
| | | | 438/585 |
| 2008/0179292 A1 * | 7/2008 | Nishimura | H01L 21/31116 |
| | | | 257/E21.252 |
| 2012/0267340 A1 * | 10/2012 | Kakimoto | H01L 21/31116 |
| | | | 216/37 |
| 2013/0237061 A1 * | 9/2013 | Takahashi | H01L 21/31116 |
| | | | 156/345.29 |
| 2017/0148640 A1 * | 5/2017 | Wang | H01L 21/3105 |
| 2018/0033608 A1 * | 2/2018 | Miyahara | H10D 64/671 |
| 2021/0143016 A1 * | 5/2021 | Yokoyama | H01J 37/32082 |
| 2021/0151326 A1 * | 5/2021 | Shimizu | H01L 21/31116 |

FOREIGN PATENT DOCUMENTS

| JP | H09-120990 A | 5/1997 |
| JP | 2012-199306 A | 10/2012 |
| JP | 2017-069230 A | 4/2017 |

(Continued)

*Primary Examiner* — Allan W. Olsen
(74) *Attorney, Agent, or Firm* — Armstrong Teasdale LLP

(57) ABSTRACT

A substrate processing method of etching a SiN film formed on the substrate includes supplying a HF gas at a processing temperature of 450 degrees C. or higher to etch the SiN film.

14 Claims, 10 Drawing Sheets

Repetition of predetermined cycle

(56) References Cited

FOREIGN PATENT DOCUMENTS

| | | |
|---|---|---|
| KR | 10-2013-0093569 A | 8/2013 |
| KR | 10-2018-0014661 A | 2/2018 |
| KR | 10-2020-0019983 A | 2/2020 |
| WO | 2018220973 A1 | 12/2018 |
| WO | 2019003663 A1 | 1/2019 |

* cited by examiner

Repetition of predetermined cycle

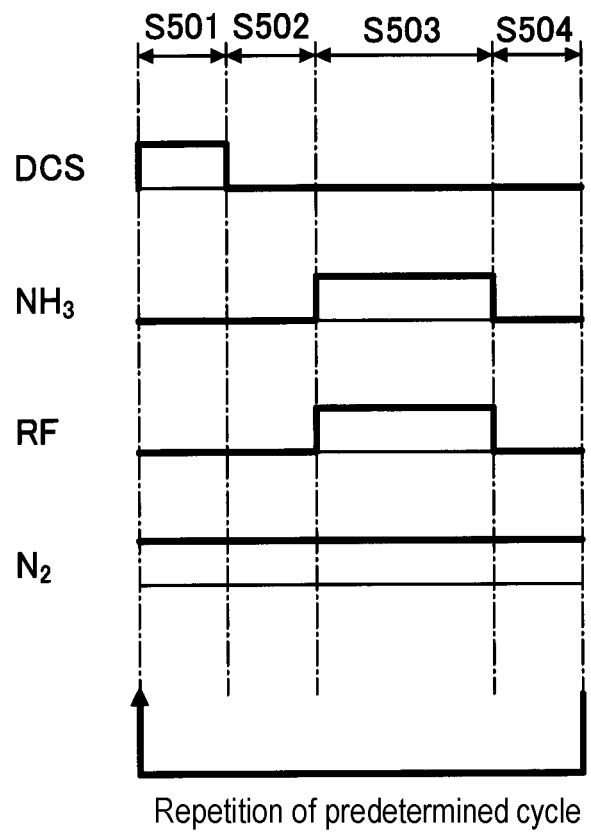
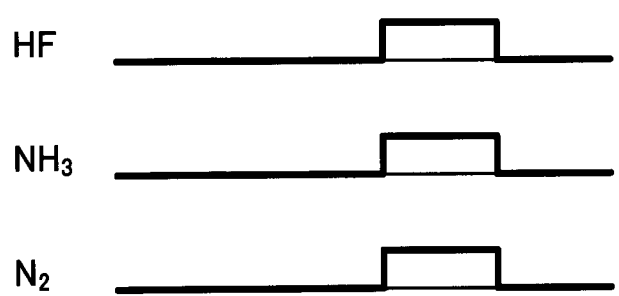

SUBSTRATE PROCESSING METHOD AND SUBSTRATE PROCESSING APPARATUS

CROSS-REFERENCE TO RELATED APPLICATIONS

The present application is a U.S. National Stage Entry of International Patent Application No. PCT/JP2021/010918, filed Mar. 17, 2021, which claims the benefit of priority to Japanese Patent Application No. 2020-053329, filed Mar. 24, 2020, each of which is hereby incorporated herein by reference in its entirety.

TECHNICAL FIELD

The present disclosure relates to a substrate processing method and a substrate processing apparatus.

BACKGROUND

For example, a substrate processing apparatus for embedding a film in a substrate having irregularities formed therein is known.

Patent Document 1 discloses a film forming method including: a step of mounting, in multiple stages into a reaction tube, a plurality of substrates in which a pattern having depressions is formed; a film forming step of forming silicon oxide films on the plurality of substrates by supplying a silicon-containing gas and an oxygen-containing gas to the reaction tube; and an etching step of etching the silicon oxide films formed in the film forming step by supplying a hydrofluoric acid gas and an ammonia gas to the reaction tube, wherein the film forming step and the etching step are alternately repeated.

PRIOR ART DOCUMENT

Patent Document

Patent Document 1: Japanese Laid-Open Patent Publication No. 2012-199306

The present disclosure provides some embodiments of a substrate processing method and a substrate processing apparatus which are capable of achieving good etching characteristics.

SUMMARY

According to an aspect of the present disclosure, there is provided a method of etching a SiN film formed on a substrate by supplying a HF gas at a processing temperature is 450 degrees C. or higher.

According to an aspect, it is possible to provide a substrate processing method and a substrate processing apparatus which are capable of achieving good etching characteristics.

BRIEF DESCRIPTION OF DRAWINGS

FIG. 10 is one example of a time chart illustrating a film forming process performed by the substrate processing apparatus.

FIG. 11 is one example of a time chart illustrating an etching process in a fourth example of the substrate processing apparatus.

DETAILED DESCRIPTION

Figure 1:
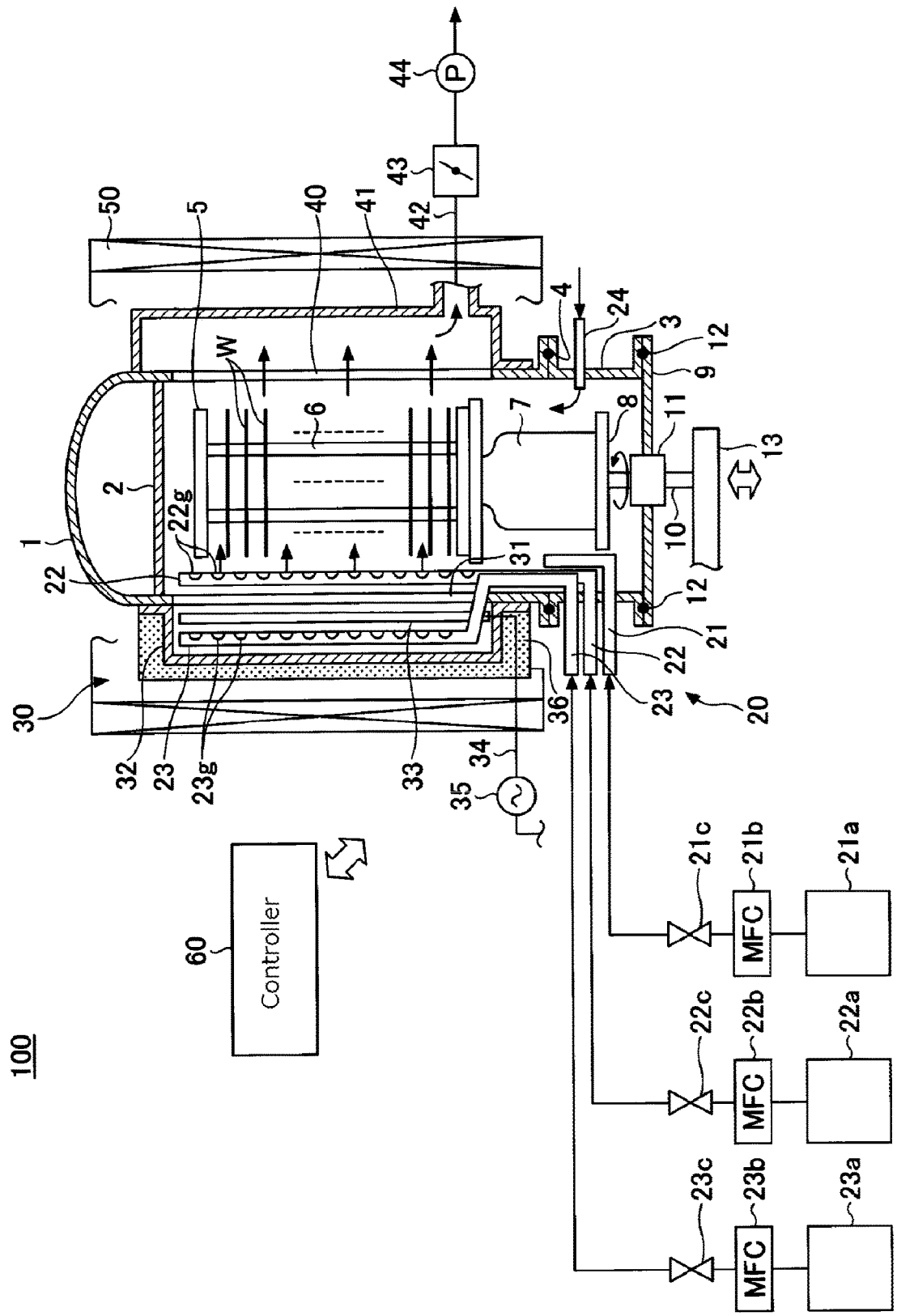
FIG. 1 is a schematic diagram illustrating a configuration example of a substrate processing apparatus.

Hereinafter, embodiments for implementing the present disclosure will be described with reference to the drawings. In each drawing, the same components will be designated by like reference numerals with the descriptions thereof omitted

[Substrate Processing Apparatus]

A substrate processing apparatus 100 according to the present embodiment will be described using FIG. 1. FIG. 1 is a schematic diagram illustrating a configuration example of the substrate processing apparatus 100.

The substrate processing apparatus 100 includes a roofed cylindrical processing container 1 with its lower end opened. The entire processing container 1 is made of, for example, quartz. A ceiling plate 2 made of quartz is provided in the vicinity of an upper end inside the processing container 1 so that a region defined below the ceiling plate 2 is sealed. A metal-made manifold 3 formed in a cylindrical shape is connected to a lower end opening of the processing container 1 via a seal member 4 such as an O ring or the like.

The manifold 3 supports the lower end of the processing container 1. A wafer boat 5 in which a plurality of (for example, 25 to 150) semiconductor wafers (hereinafter referred to as "wafers W") as substrates are placed in multiple stages is inserted into the processing container 1 from below the manifold 3. As described above, the plurality of substrates W are substantially horizontally accommodated in the processing container 1 at intervals along a vertical direction. The wafer boat 5 is formed of, for example, quartz. The wafer boat 5 includes three rods 6 (of which only two are illustrated in FIG. 1). The plurality of substrates W are supported by grooves (not illustrated) formed in the rods 6.

The wafer boat 5 is placed on a table 8 via a quartz-made heat-insulating cylinder 7. The table 8 is supported on a rotary shaft 10 that penetrates a lid 9 made of metal (stainless steel) and configured to open and close a lower end opening of the manifold 3.

A magnetic fluid seal 11 is provided in the penetrating portion of the rotary shaft 10. The magnetic fluid seal 11 rotatably supports the rotary shaft 10 while airtightly sealing the rotary shaft 10. A seal member 12 for keeping the interior of the processing container 1 in a sealed state is provided between a peripheral portion of the lid 9 and the lower end of the manifold 3.

The rotary shaft 10 is attached to the tip of an arm 13 supported by, for example, an elevating mechanism (not illustrated) such as a boat elevator or the like. The wafer boat 5 and the lid 9 are raised and lowered together and are inserted into and removed from the interior of the processing container 1. Alternatively, the table 8 may be fixedly provided at the side of the lid 9 so that the wafer W can be processed without rotating the wafer boat 5.

Further, the substrate processing apparatus 100 includes a gas supplier 20 that supplies predetermined gases, such as a processing gas, a purge gas or the like, into the processing container 1.

The gas supplier 20 includes gas supply pipes 21, 22, 23, and 24. The gas supply pipe 21 is formed of, for example, quartz, and is constituted with a quartz pipe that passes through a sidewall of the manifold 3 inward and is bent upward. The gas supply pipe 22 is formed of, for example, quartz, and passes through the sidewall of the manifold 3 inward, is bent upward, and extends vertically. A plurality of gas holes 22g is formed at predetermined intervals in a vertical portion of the gas supply pipe 22 over a vertical length corresponding to a wafer support range of the wafer boat 5. A gas is discharged via each gas hole 22g in a horizontal direction. The gas supply pipe 23 is formed of, for example, quartz, and passes through the sidewall of the manifold 3 inward, is bent upward, and extends vertically. In a vertical portion of the gas supply pipe 23, a plurality of gas holes 23g is formed at predetermined intervals over the vertical length corresponding to the wafer support range of the wafer boat 5. A gas is discharged via each gas hole 23g in the horizontal direction. The gas supply pipe 24 is formed of, for example, quartz, and is constituted with a short quartz pipe provided to penetrate the sidewall of the manifold 3.

An etchant gas is supplied from a gas source 21a to the gas supply pipe 21 via a gas pipe. The gas pipe is provided with a flow controller 21b and an on-off valve 21c. With this configuration, the etchant gas from the gas source 21a is supplied into the processing container 1 via the gas pipe and the gas supply pipe 21. As the etchant gas, a hydrogen halide such as, for example, hydrogen fluoride (HF) may be used.

The vertical portion (in which the gas holes 22g are formed) of the gas supply pipe 22 is provided inside the processing container 1. The gas supply pipe 22 is supplied with a processing gas from the gas source 22a via the gas pipe. The gas pipe is provided with a flow controller 22b and an on-off valve 22c. With this configuration, the processing gas from the gas source 22a is supplied into the processing container 1 via the gas pipe and the gas supply pipe 22. In addition, the processing gas supplied from the gas source 22a will be described later.

The vertical portion (in which the gas holes 23g are formed) of the gas supply pipe 23 is provided in a plasma generation space which will be described later. The gas supply pipe 23 is supplied with a processing gas from the gas source 23a via the gas pipe. The gas pipe is provided with a flow controller 23b and an on-off valve 23c. With this configuration, the processing gas from the gas source 23a is supplied to the plasma generation space via the gas pipe and the gas supply pipe 22, is plasmarized in the plasma generation space, and is supplied into the processing container 1. In addition, the processing gas supplied from the gas source 23a will be described later.

The gas supply pipe 24 is supplied with a purge gas from a purge gas source (not illustrated) via a gas pipe. The gas pipe (not illustrated) is provided with a flow controller (not illustrated) and an on-off valve (not illustrated). With this configuration, the purge gas from the purge gas source is supplied into the processing container 1 via the gas pipe and the gas supply pipe 24. As the purge gas, an inert gas such as, for example, argon (Ar), nitrogen ($N_2$) or the like, may be used. Although the case in which the purge gas is supplied from the purge gas source into the processing container 1 via the gas pipe and the gas supply pipe 24 has been described, the present disclosure is not limited thereto. The purge gas may be supplied from either the gas supply pipe 21 or the gas supply pipe 22.

A plasma generation mechanism 30 is formed in a portion of the sidewall of the processing container 1. The plasma generation mechanism 30 forms the processing gas from the gas source 23a into plasma.

The plasma generation mechanism 30 includes a plasma partition wall 32, a pair of plasma electrodes 33 (only one illustrated in FIG. 1), a power feed line 34, a radio-frequency power supply 35, and an insulating protective cover 36.

The plasma partition wall 32 is hermetically welded to an outer wall of the processing container 1. The plasma partition wall 32 is formed of quartz, for example. The plasma partition wall 32 is concave in a cross section and covers an opening 31 formed in the sidewall of the processing container 1. The opening 31 is formed to be elongated in the vertical direction so as to cover all the substrates W supported by the wafer boat 5 in the vertical direction. The gas supply pipe 23 for discharging the processing gas is arranged in an inner space defined by the plasma partition wall 32 and communicating with the interior of the processing container 1, that is, the plasma generation space. In addition, the gas supply pipe 22 for discharging the processing gas is provided at a position close to the substrate W along an inner sidewall of the processing container 1 outside the plasma generation space.

The pair of plasma electrodes 33 (only one illustrated in FIG. 1) have an elongated shape, and are arranged on outer surfaces of both sidewalls of the plasma partition wall 32 to face each other along the vertical direction. Each plasma electrode 33 is held by, for example, a holding portion (not illustrated) provided on the side surface of the plasma partition wall 32. The power feed line 34 is connected to a lower end of each plasma electrode 33.

The power feed line 34 electrically connects each plasma electrode 33 and the radio-frequency power supply 35. In the illustrated example, one end of the power feed line 34 is connected to the lower end of each plasma electrode 33 and the other end thereof is connected to the radio-frequency power supply 35.

The radio-frequency power supply 35 is connected to the lower end of each plasma electrode 33 via the power feed line 34, and supplies radio-frequency power of, for example, 13.56 MHz, to the pair of plasma electrodes 33. With this configuration, the radio-frequency power is applied into the plasma generation space defined by the plasma partition wall 32. The processing gas discharged from the gas supply pipe 22 is plasmarized inside the plasma generation space to which the radio-frequency power is applied, and is supplied to the interior of the processing container 1 via the opening 31.

The insulating protective cover 36 is provided outside the plasma partition wall 32 so as to cover the plasma partition wall 32. A refrigerant passage (not illustrated) is provided in an inner portion of the insulating protective cover 36. The plasma electrodes 33 are cooled by allowing a refrigerant such as a cooled nitrogen ($N_2$) gas to flow through the refrigerant passage. Moreover, a shield (not illustrated) may be provided between the plasma electrodes 33 and the insulating protective cover 36 so as to cover the plasma electrodes 33. The shield is formed of a good conductor such as, for example, metal or the like, and is grounded.

An exhaust port 40 for evacuating the interior of the processing container 1 is provided in a sidewall portion of the processing container 1, which faces the opening 31. The exhaust port 40 is formed to be elongated vertically in correspondence to the wafer boat 5. An exhaust port cover member 41 formed in a U-shape in cross-section so as to cover the exhaust port 40 is provided in a portion of the processing container 1, which corresponds to the exhaust port 40. The exhaust port cover member 41 extends upward along the sidewall of the processing container 1. An exhaust pipe 42 for exhausting the processing container 1 via the exhaust port 40 is connected to a lower portion of the exhaust port cover member 41. A pressure control valve 43 for controlling an internal pressure of the processing container 1, and an exhaust device 44 including a vacuum pump and the like are connected to the exhaust pipe 42. The interior of the processing container 1 is exhausted by the exhaust device 44 via the exhaust pipe 42.

In addition, a cylindrical heating mechanism 50 for heating the processing container 1 and the substrates W in the processing container 1 is provided so as to surround the outer periphery of the processing container 1.

In addition, the substrate processing apparatus 100 includes a controller 60. The controller 60 controls, for example, the operation of each part of the substrate processing apparatus 100, for example, the supply and cutoff of each gas by the opening and closing of the on-off valves 21c to 23c, the control of the flow rate of each gas by the flow controllers 21b to 23b, and the exhaust by the exhaust device 44. Moreover, the controller 60 performs, for example, the on-off control of the radio-frequency power by the radio-frequency power supply 35, and the control of the temperature of the substrates W by the heating mechanism 50.

The controller 60 may be, for example, a computer or the like. Further, a computer program for executing the operation of each part of the substrate processing apparatus 100 is stored in a storage medium. The storage medium may be, for example, a flexible disk, a compact disk, a hard disk, a flash memory, a DVD, or the like.

<Etching Process in First Example>

Figure 2:
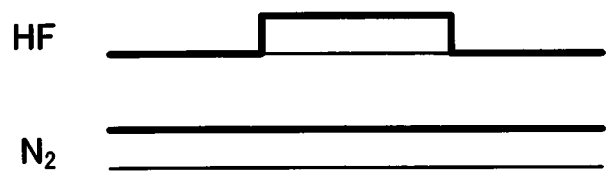
FIG. 2 is one example of a time chart illustrating an etching process in a first example of the substrate processing apparatus.

Next, one example of substrate processing performed by the substrate processing apparatus 100 illustrated in FIG. 1 will be described. FIG. 2 is one example of a time chart illustrating an etching process in the first example by the substrate processing apparatus 100. Here, the substrate processing apparatus 100 etches a SiN film formed on the substrate W.

In the etching process of the first example, a HF gas is supplied as an etchant gas from the gas supply pipe 21, and a $N_2$ gas is supplied as a carrier gas from the gas supply pipe 24. Further, in the substrate processing apparatus 100 that performs the etching process of the first example, the gas supply pipes 22 and 23 and the plasma generation mechanism 30 may be omitted.

Here, preferable ranges of etching conditions of the SiN film in the etching process of the first example are as follows.

Figure 3A:
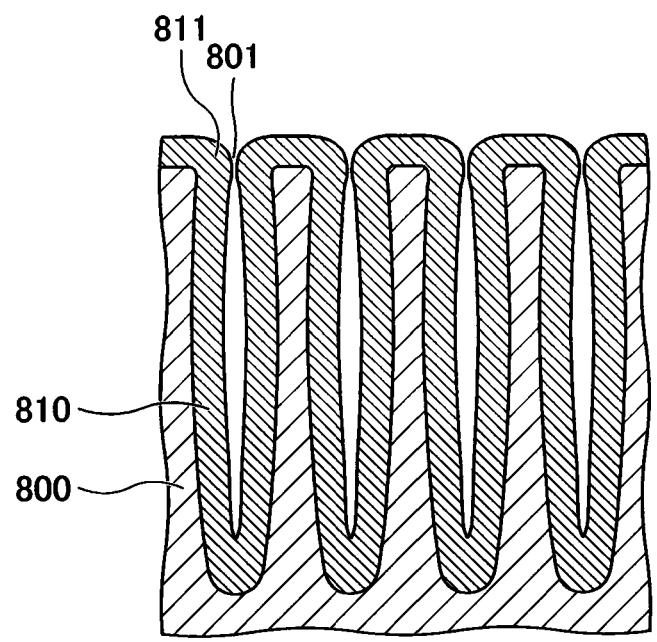
FIG. 3A is one example of a schematic cross-sectional view of a substrate in the etching process of the first example.

Temperature: 450 to 650 degrees C.
Pressure: 5 to 150 Torr
Flow rate of HF gas: 500 to 5,000 sccm
Flow rate of $N_2$ gas: 500 to 5,000 sccm FIG. 3A is one example of a schematic cross-sectional view of the substrate W before the etching process of the first example. A concave structure 800 such as a trench is formed in a surface of the substrate W. A conformal SiN film 810 is also formed on the surface of the substrate W. Further, a shoulder portion 811 of the SiN film 810 projects toward an opening portion 801 of the concave structure 800, so that the opening portion 801 of the concave structure 800 is closed.

Figure 3B:
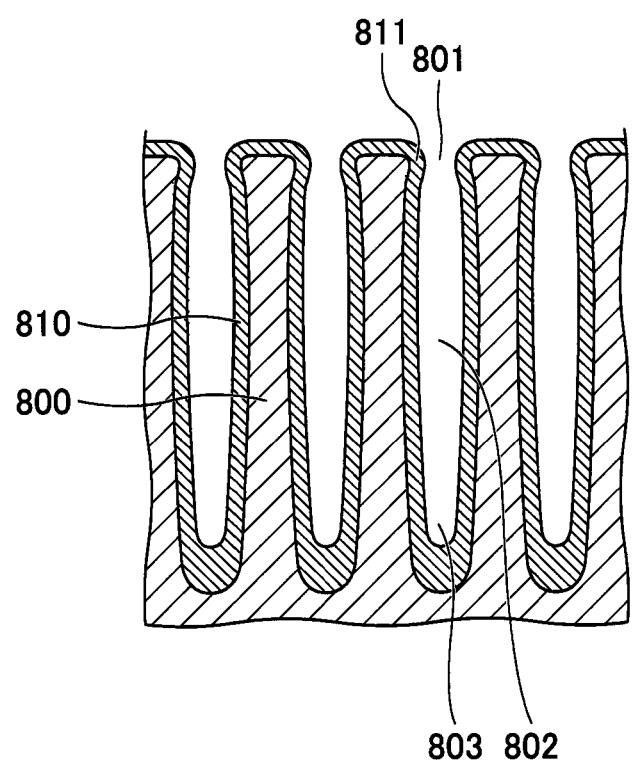
FIG. 3B is one example of the schematic cross-sectional view of the substrate in the etching process of the first example.

FIG. 3B is one example of a schematic cross-sectional view of the substrate W after the etching process of the first example. According to the etching process of the first example, the shoulder portion 811 of the SiN film 810 in the opening portion 801 is etched more than a middle portion 802 and an inner portion 803 of the concave structure 800. This makes it possible to prevent the opening portion 801 of the SiN film 810 from being closed.

Here, when a processing temperature at the time of etching is set to 120 degrees C. or lower, ammonium silicofluoride is formed on the surface of the SiN film 810 by the HF gas. Then, by heating the substrate W to a temperature of 160 degrees C. or higher, the ammonium silicofluoride on the surface is sublimated and the SiN film 810 is etched.

In this process, after performing the process of forming the ammonium silicofluoride using silicon or nitrogen atoms contained in the SiN film 810, an ammonium silicofluoride layer is removed by the supply of heat energy by which the ammonium silicofluoride is sublimated and the pressure conditions. Simultaneously, a portion of the SiN film consumed during the formation of the ammonium silicofluoride is reduced. The ammonium silicofluoride can be formed uniformly or non-uniformly on the SiN film coated on the concave structure 800 by the conditions of temperature, gas, and pressure in the process of forming the ammonium silicofluoride.

On the other hand, in the etching process of the first example, a processing temperature at the time of etching is set to 550 degrees C. In this case, radical species of the HF gas are produced inside the processing container 1 at a high temperature. The radical species of the HF gas collide (attack) with the surface of the SiN film 810, so that reaction products such as SiFx or NFx are produced. The reaction products are discharged from the interior of the processing container 1 by the exhaust device 44. As a result, the SiN film 810 is etched. Here, in the etching process of the first example, an etching profile (conformality) may be changed by changing the condition of gas or pressure when removing the SiN film coated on the concave structure 800. The etching conformality also varies with a ratio of depth and width dimensions of the concave structure 800. In a method of the first example, according to the pressure condition when the etching gas is supplied, a change may be made from conformal etching to a profile in which an opening side is preferentially etched. Increasing the processing pressure as the changing means provides the following effects. Many collisions may occur at the opening portion 801 rather than the middle portion 802 and the inner portion 803 of the concave structure 800. Thus, the shoulder portion 811 of the SiN film 810 is etched more. As a result, an opening shape (e.g., a V-shape) in which the opening portion 801 widens may be obtained. Further, in a film forming process as a subsequent process, an easy-to-embed shape in which a film is easy to be embedded in the concave structure 800 may be obtained. In addition, an inert gas such as an Ar gas, or a reducing gas such as hydrogen or $NH_3$ may be supplied in parallel to the introduction of the HF gas. Moreover, the etching gas may be activated by applying RF in parallel to the introduction of the HF gas. This makes it possible to control a production concentration of the active species effective for etching. Thus, the change may be made from conformal etching to the profile in which the opening side is preferentially etched as described above.

<Etching Process of Second Example>

Figure 4:
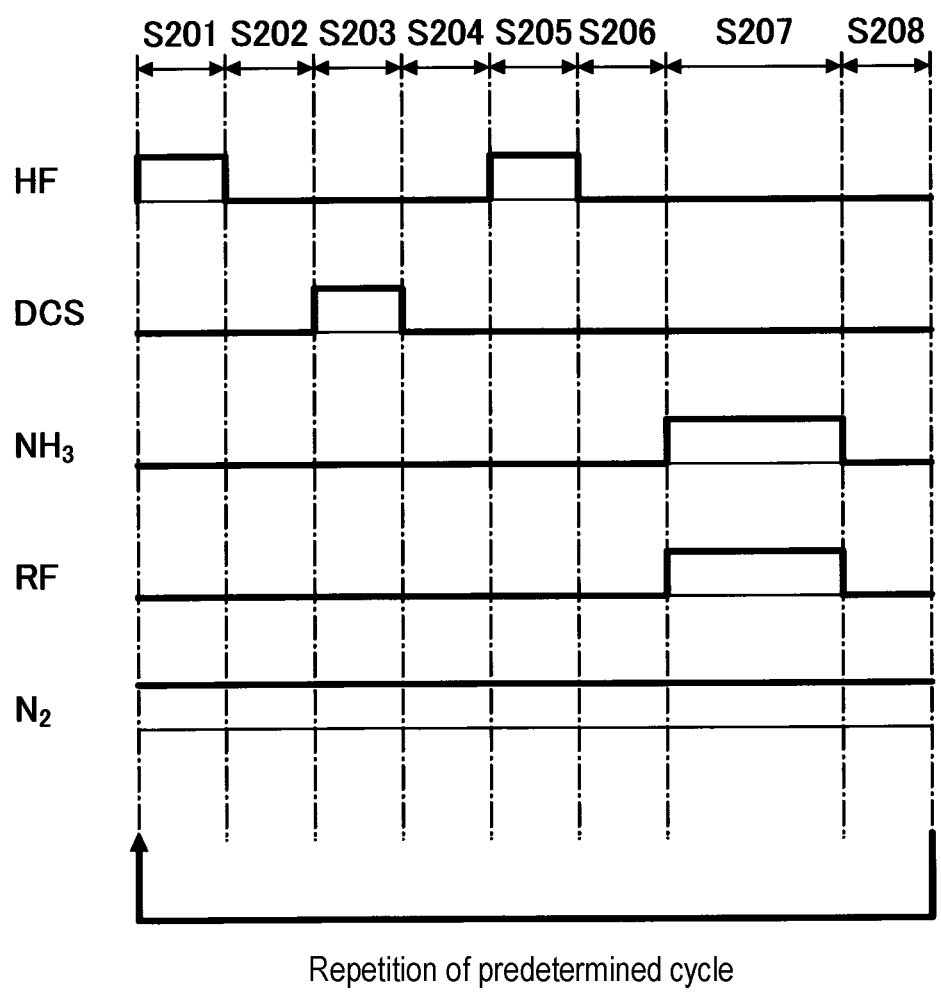
FIG. 4 is one example of a time chart illustrating an etching process in a second example of the substrate processing apparatus.

FIG. 4 is one example of a time chart illustrating an etching process of a second example performed by the substrate processing apparatus 100. Here, the substrate processing apparatus 100 etches the SiN film formed on the substrate W.

In the etching process of the second example, a HF gas is supplied as an etchant gas from the gas supply pipe 21, a DCS (dichlorosilane, $SiH_2Cl_2$) gas is supplied as a processing gas from the gas supply pipe 22, a $NH_3$ gas is supplied as a processing gas from the gas supply pipe 23, and a $N_2$ gas is supplied as a carrier gas from the gas supply pipe 24. In addition, the processing gas supplied from the gas supply pipe 22 is not limited to the DCS gas, but may be HCDS (hexachlorodisilane), halogenated silanes such as fluorine, bromine, iodine and the like, higher-order silanes, aminosilane compounds, silylamines, or the like. Further, the processing gas supplied from the gas supply pipe 23 is not limited to the $NH_3$ gas, but may be nitrogen, a mixed gas of nitrogen and hydrogen and argon, helium, or the like, a nitrogen-containing compound such as a hydrazine compound, or the like.

The etching process illustrated in FIG. 4 is a process of etching a SiN film formed on the substrate W by repeating a predetermined number of cycles including step S201 of supplying the HF gas, step S202 of performing a purging process, step S203 of supplying the DCS gas, step S204 of performing the purging process, step S205 of supplying the HF gas, step S206 of performing the purging process, step S207 of supplying the $NH_3$ gas while applying RF power, and step S208 of performing the purging process. In FIG. 4, one cycle is merely illustrated. Moreover, in steps S201 to S208, the $N_2$ gas as a purge gas is constantly (continuously) supplied from the gas supply pipe 24 during the etching process.

Step S201 of supplying the HF gas is a step of supplying the HF gas into the processing container 1. In step S201 of supplying the HF gas, the HF gas is supplied into the processing container 1 from the gas source 21a via the gas supply pipe 21 by opening the on-off valve 21c.

Step S202 of performing the purging process is a step of purging the excess HF gas or the like inside the processing container 1. In step S202 of performing the purging process, the on-off valve 21c is closed to stop the supply of the HF gas. As a result, the purge gas supplied constantly from the gas supply pipe 24 purges the excess HF gas and the like inside the processing container 1.

Step S203 of supplying the DCS gas is a step of supplying the DCS gas. In step S203 of supplying the DCS gas, the DCS gas is supplied from the gas source 22a into the processing container 1 via the gas supply pipe 22 by opening the on-off valve 22c.

Step S204 of performing the purging process is a step of purging the excess DCS gas or the like inside the processing container 1. In step S204 of performing the purging process, the on-off valve 22c is closed to stop the supply of the DCS gas. As a result, the purge gas supplied constantly from the gas supply pipe 24 purges the excess DCS gas and the like inside the processing container 1.

Step S205 of supplying the HF gas is a step of supplying the HF gas into the processing container 1. In step S205 of supplying the HF gas, the HF gas is supplied from the gas source 21a into the processing container 1 via the gas supply pipe 21 by opening the on-off valve 21c.

Step S206 of performing the purging process is a step of purging the excess HF gas or the like inside the processing container 1. In step S206 of performing the purging process, the on-off valve 21c is closed to stop the supply of the HF gas. As a result, the purge gas supplied constantly from the gas supply pipe 24 purges the excess HF gas and the like inside the processing container 1.

Step S207 of supplying the $NH_3$ gas while applying the RF power is a step of supplying active species of the $NH_3$ gas. In step S207, the $NH_3$ gas is supplied from the gas source 23a inward of the plasma partition wall 32 via the gas supply pipe 23 by opening the on-off valve 23c. Further, RF is applied from the radio-frequency power supply 35 to the plasma electrodes 33 to generate plasma inside the plasma partition wall 32. Active species of the $NH_3$ gas are generated and are supplied into the processing container 1 via the opening 31.

Step S208 of performing the purging process is a step of purging the excess $NH_3$ gas, reaction products (($NH_4)_2SiF_6$ to be described later), or the like inside the processing container 1. In step S208 of performing the purging process, the on-off valve 23c is closed to stop the supply of the $NH_3$ gas. Further, the application of RF to the plasma electrodes 33 by the radio-frequency power supply 35 is stopped to stop the plasma generation inside the plasma partition wall 32. As a result, the purge gas supplied constantly from the gas supply pipe 24 purges the excess $NH_3$ gas, the reaction products, or the like inside the processing container 1.

By repeating the above cycle, the SiN film formed on the substrate W is etched.

Here, preferable ranges of etching conditions used in the etching process of the second example are as follows.

Temperature: 250 to 630 degrees C.
Pressure: 0.1 to 100 Torr
Flow rate of HF gas: 500 to 5,000 sccm
Flow rate of DCS gas: 500 to 5,000 sccm
Flow rate of $NH_3$ gas: 500 to 10,000 sccm
Flow rate of $N_2$ gas: 50 to 5,000 sccm
Time period of step S201: 2 to 30 seconds
Time period of step S202: 5 to 30 seconds
Time period of step S203: 2 to 30 seconds
Time period of step S204: 2 to 30 seconds
Time period of step S205: 2 to 30 seconds
Time period of step S206: 5 to 30 seconds
Time period of step S207: 5 to 60 seconds
Time period of step S208: 5 to 30 seconds
RF power: 50 to 500 W The etching process of the second example will be further described with reference to FIGS. 5A to 5E. FIGS. 5A to 5E are examples of schematic cross-sectional views of the substrate W in the etching process of the second example.

Figure 5A:
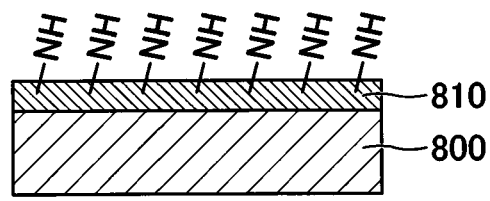
FIG. 5A is one example of a schematic cross-sectional view of a substrate in the etching process of the second example.

FIG. 5A shows a state of the surface of the substrate W before starting step S201 of supplying the HF gas. As illustrated in FIG. 5A, NH groups exist at the end of the surface of the substrate W.

Figure 5B:
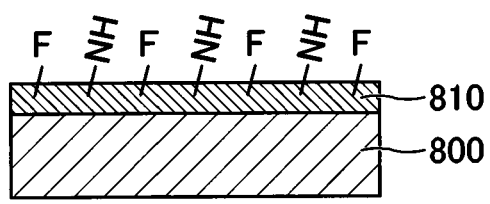
FIG. 5B is one example of the schematic cross-sectional view of the substrate in the etching process of the second example.

In step S201 of supplying the HF gas, the HF gas is supplied into the processing container 1 and the substrate W is exposed to the HF gas so that the end is fluorinated as illustrated in FIG. 5B.

Figure 5C:
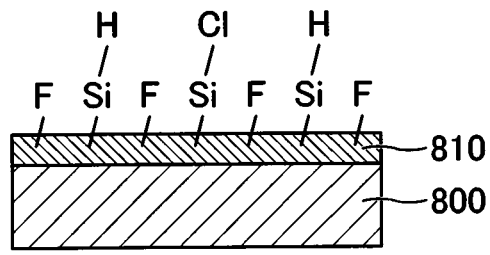
FIG. 5C is one example of the schematic cross-sectional view of the substrate in the etching process of the second example.

In step S203 of supplying the DCS gas, the DCS gas is supplied into the processing container 1 and the substrate W is exposed to the DCS gas so that the NH groups at the end are substituted with SiH groups or SiCl groups derived from DCS as illustrated in FIG. 5C.

Figure 5D:
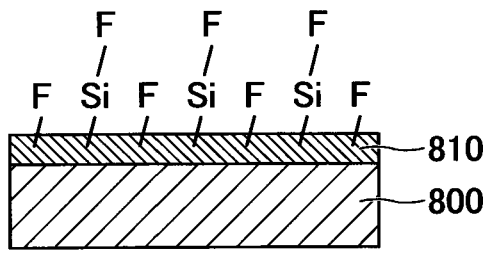
FIG. 5D is one example of the schematic cross-sectional view of the substrate in the etching process of the second example.

In step S205 of supplying the HF gas, the HF gas is supplied into the processing container 1 and the substrate W is exposed to the HF gas so that H or Cl at the end is fluorinated as illustrated in FIG. 5D.

Figure 5E:
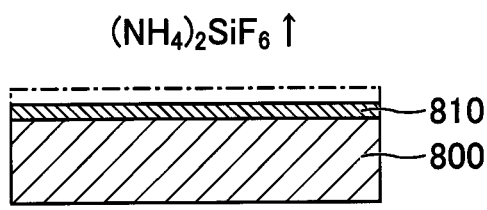
FIG. 5E is one example of the schematic cross-sectional view of the substrate in the etching process of the second example.

In step S207 of supplying the $NH_3$ gas while applying the RF power, $NH_3$ radicals are supplied into the processing container 1 and the substrate W is exposed to the $NH_3$ radicals so that $(NH_4)_2Si_2F_6$ as a reaction product is produced as illustrated in FIG. 5E. $(NH_4)_2Si_2F_6$ is sublimated and exhausted by the exhaust device 44.

In this case, concentrations of the $NH_3$ radicals are different from each other in the opening portion 801, the middle portion 802 and the inner portion 803 of the concave structure 800. That is, the opening portion 801 has more $NH_3$ radicals than the middle portion 802 and the inner portion 803. Therefore, the shoulder portion 811 of the SiN film 810 is etched more. As a result, an opening shape (e.g., a V-shape) in which the opening portion 801 widens may be obtained. Further, in the film forming process as a subsequent process, an easy-to-embed shape in which a film is easy to be embedded in the concave structure 800 may be obtained. Moreover, by controlling the supply of the $NH_3$ radicals in terms of the depth direction in the trench, it is possible to uniformly etch from the upper portion to the lower portion of the concave structure 800, or to preferentially remove the upper portion.

Figure 6:
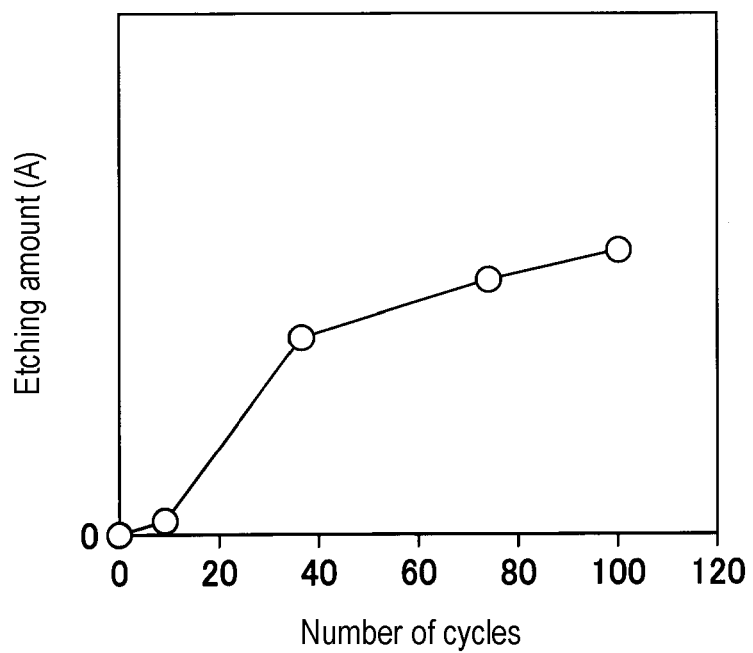
FIG. 6 is one example of a graph illustrating a relationship between the number of cycles and an etching amount in the etching process of the second example.

FIG. 6 is one example of a graph illustrating a relationship between the number of cycles and an etching amount in the etching process of the second example. As illustrated in FIG. 6, the etching amount increases with an increase in the number of cycles. In other words, the etching amount may be controlled with high precision by the number of cycles. Specifically, an etching rate of about 0.3 to 1.0 Å per cycle may be obtained.

<Etching Process of Third Example>

Figure 7:
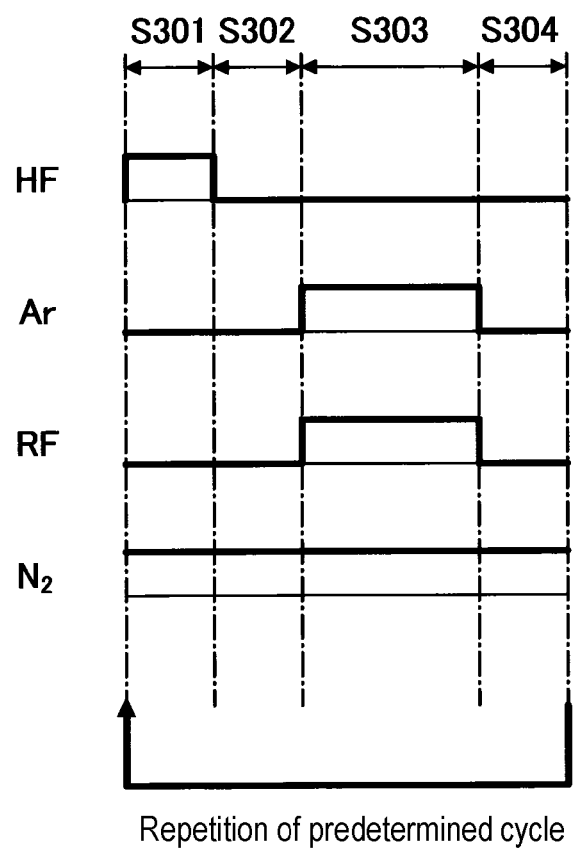
FIG. 7 is one example of a time chart illustrating an etching process in a third example of the substrate processing apparatus.

FIG. 7 is one example of a time chart illustrating an etching process of a third example performed by the substrate processing apparatus 100. Here, the substrate processing apparatus 100 etches the SiN film formed on the substrate W.

In the etching process of the third example, a HF gas is supplied as an etchant gas from the gas supply pipe 21, an Ar gas is supplied as a processing gas from the gas supply pipe 23, and a $N_2$ gas is supplied as a carrier gas from the gas supply pipe 24. In addition, the processing gas supplied from the gas supply pipe 23 is not limited to the Ar gas, but may be a reducing gas containing hydrogen and deuterium, for example, ammonia compounds, hydrazine compounds, or the like. These gases may be in a state of being mixed with an inert gas such as Ar or the like. Further, in the substrate processing apparatus 100 that performs the etching process of the third example, the gas supply pipe 22 may be omitted.

The etching process illustrated in FIG. 7 is a process of etching a SiN film formed on the substrate W by repeating, a predetermined number of times, a cycle including step S301 of supplying the HF gas, step S302 of performing a purging process, step S303 of supplying the Ar gas while applying RF power, and step S304 of performing the purging process. Further, in FIG. 7, only one cycle is illustrated. Moreover, in steps S301 to S304, a $N_2$ gas which is a purge gas is supplied constantly (continuously) from the gas supply pipe 24 during the etching process.

Step S301 of supplying the HF gas is a step of supplying the HF gas into the processing container 1. In step S301 of supplying the HF gas, the HF gas is supplied into the processing container 1 from the gas source 21a via the gas supply pipe 21 by opening the on-off valve 21c.

Step S302 of performing the purging process is a step of purging the excess HF gas or the like inside the processing container 1. In step S302 of performing the purging process, the on-off valve 21c is closed to stop the supply of the HF gas. As a result, the purge gas supplied constantly from the gas supply pipe 24 purges the excess HF gas and the like inside the processing container 1.

Step S303 of supplying the Ar gas while applying the RF power is a step of supplying radicals of the Ar gas. In step S303, the Ar gas is supplied from the gas source 23a inward of the plasma partition wall 32 via the gas supply pipe 23 by opening the on-off valve 23c. Further, RF is applied to the plasma electrodes 33 by the radio-frequency power supply 35 to generate plasma inside the plasma partition wall 32. The radicals of the Ar gas are generated and supplied into the processing container 1 via the opening 31.

Step S304 of performing the purging process is a step of purging the excess Ar gas, reaction products, or the like inside the processing container 1. In step S304 of performing the purging process, the on-off valve 23c is closed to stop the supply of the Ar gas. Further, the application of RF to the plasma electrodes 33 by the radio-frequency power supply 35 is stopped to stop the generation of plasma inside the plasma partition wall 32. As a result, the purge gas supplied constantly from the gas supply pipe 24 purges the excess Ar gas, the reaction products, or the like inside the processing container 1.

By repeating the above cycle, the SiN film formed on the substrate W is etched.

In this case, preferable ranges of etching conditions used in the etching process of the third example are as follows.

Temperature: 250 to 630 degrees C.
Pressure: 0.1 to 10 Torr
Flow rate of HF gas: 500 to 5,000 sccm
Flow rate of Ar gas: 500 to 5,000 sccm
Flow rate of $N_2$ gas: 50 to 5,000 sccm
Time period of step S301: 5 to 60 seconds
Time period of step S302: 5 to 30 seconds
Time period of step S303: 5 to 30 seconds
Time period of step S304: 5 to 30 seconds
RF power: 50 to 500 W The etching process of the third example will be further described.

In step S301 of supplying the HF gas, the HF gas is supplied into the processing container 1 and the substrate W is exposed to the HF gas so that NH groups existing on the surface of the substrate W are fluorinated.

In step S303 of supplying the Ar gas while applying the RF power, Ar radicals are supplied into the processing container 1 and the substrate W is exposed to the AR radicals so that the Ar radicals collide (attack) with the surface of the SiN film to produce reaction products such as $SiF_4$. The reaction products are discharged from the interior of the processing container 1 by the exhaust device 44. The SiN film 810 is etched by obtaining energy from Ar radicals or hydrogen radicals activated on the surface of the fluorinated SiN or $SiO_2$ film.

Here, in the etching process of the third example, many collisions may occur at the opening portion 801 rather than the middle portion 802 and the inner portion 803 of the concave structure 800. Therefore, the shoulder portion 811 of the SiN film 810 is etched more. As a result, an opening shape (e.g., a V-shape) in which the opening portion 801 widens may be obtained. Further, in a film forming process as a subsequent process, an easy-to-embed shape in which a film is easy to be embedded in the concave structure 800 may be obtained.

Figure 8:
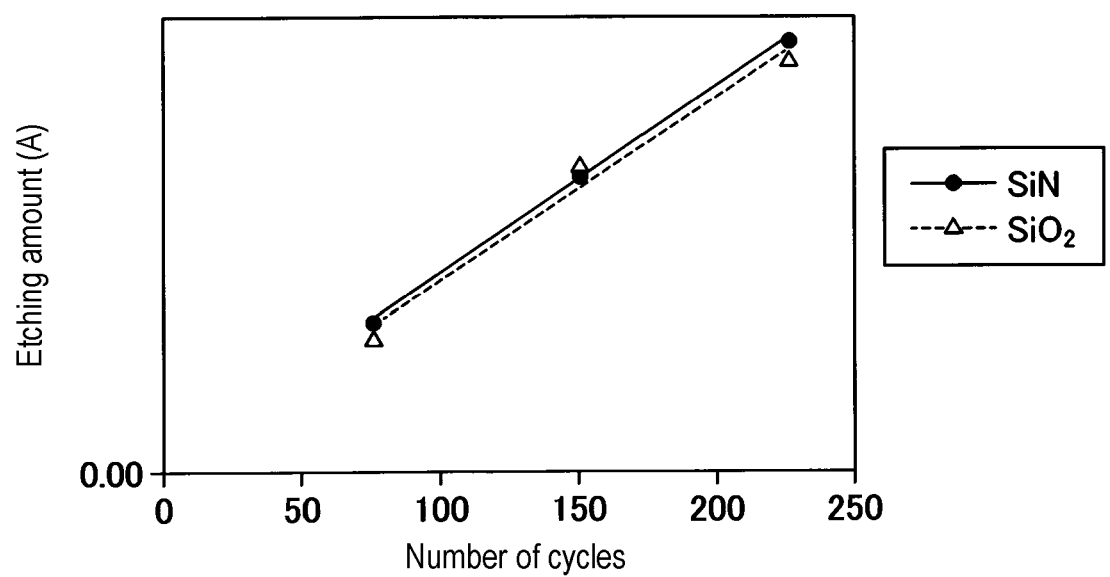
FIG. 8 is one example of a graph illustrating a relationship between the number of cycles and an etching amount in the etching process of the third example.

FIG. 8 is one example of a graph illustrating a relationship between the number of cycles and an etching amount in the etching process of the third example. In addition, in FIG. 8, there are illustrated examples of a SiN film and a $SiO_2$ film as films to be etched. As illustrated in FIG. 8, the etching amount increases with an increase in the number of cycles. In other words, the etching amount may be controlled with high precision by the number of cycles.

<Film Forming Process>

Figure 9:
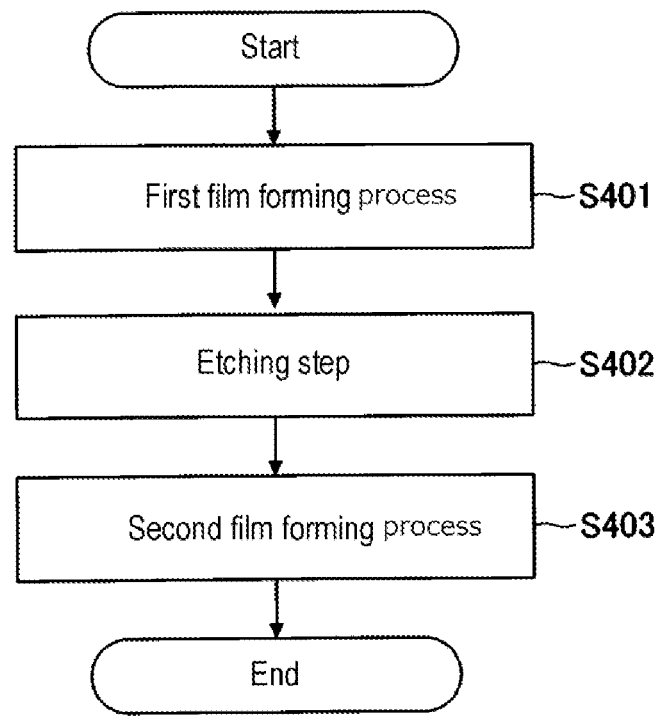
FIG. 9 is one example of a flowchart illustrating one example of a film forming process performed by the substrate processing apparatus.

Next, a film forming process performed by the substrate processing apparatus 100 will be described with reference to FIG. 9. FIG. 9 is one example of a flowchart illustrating one example of the film forming process performed by the substrate processing apparatus 100. Here, the substrate processing apparatus 100 embeds a SiN film in the substrate W in which a concave structure such as a trench is formed.

In step S401, the SiN film is formed on the substrate W in which the concave structure such as a trench is formed (in a first film forming process).

In step S402, the SiN film formed on the substrate W is etched (in an etching process). In addition, the etching processes of the first to third examples described above may be used in the etching process S402. As a result, an opening shape (e.g., a V-shape) in which the opening portion widens may be obtained. Further, in a film forming process as a subsequent process an easy-to-embed shape in which a film is easy to be embedded in the concave structure.

In step S403, a SiN film is formed on the substrate W which has been subjected to the etching process (in a second film forming process).

<Film Forming Process>

The film forming processes performed in steps S401 and S403 will be further described with reference to FIG. 10. FIG. 10 is one example of a time chart illustrating the film forming process performed by the substrate processing apparatus 100. Here, the substrate processing apparatus 100 forms the SiN film on the substrate W.

In each film forming process, the DCS gas is supplied as a processing gas from the gas supply pipe 22, the $NH_3$ gas is supplied as a processing gas from the gas supply pipe 23, and the $N_2$ gas is supplied as a carrier gas from the gas supply pipe 24. In addition, the processing gas supplied from the gas supply pipe 22 is not limited to the DCS gas, but may be HCDS (hexachlorodisilane), halogenated silanes such as fluorine, bromine, iodine and the like, higher-order silanes, aminosilane compounds, silylamines, or the like. Further, the processing gas supplied from the gas supply pipe 23 is not limited to the $NH_3$ gas, but may be nitrogen or a mixed gas of nitrogen and hydrogen and argon, helium, or the like, a nitrogen-containing compound such as a hydrazine compound, or the like. Moreover, in the substrate processing apparatus 100 that performs the film forming process, the gas supply pipe 21 may be omitted.

The etching process illustrated in FIG. 10 is a process of etching the SiN film formed on the substrate W by repeating, a predetermined number of times, a cycle including step S501 of supplying a DCS gas, step S502 of performing a purging process, step S503 of supplying a $NH_3$ gas while applying RF power, and step S504 of performing the purging process. Further, in FIG. 10, only one cycle is illustrated. Moreover, in steps S501 to S504, a $N_2$ gas as a purge gas is supplied constantly (continuously) from the gas supply pipe 24 during the etching process.

Step S501 of supplying the DCS gas is a step of supplying the DCS gas into the processing container 1. In step S501 of supplying the DCS gas, the DCS gas is supplied into the processing container 1 from the gas source 22a via the gas supply pipe 22 by opening the on-off valve 22c.

Step S502 of performing the purging process is a step of purging the excess DCS gas or the like inside the processing container 1. In step S502 of performing the purging process, the on-off valve 22c is closed to stop the supply of the DCS gas. As a result, the purge gas supplied constantly from the gas supply pipe 24 purges the excess DCS gas and the like inside the processing container 1.

Step S503 of supplying the $NH_3$ gas while applying the RF power is a step of supplying radicals of the $NH_3$ gas. In step S503, the $NH_3$ gas is supplied inward of the plasma partition wall 32 from the gas source 23a via the gas supply pipe 23 by opening the on-off valve 23c. Further, RF is applied to the plasma electrodes 33 by the radio-frequency power supply 35 to generate plasma inside the plasma partition wall 32. The radicals of the $NH_3$ gas are generated and supplied into the processing container 1 via the opening 31.

Step S504 of performing the purging process is a step of purging the excess $NH_3$ gas or the like inside the processing container 1. In step S504 of performing the purging process, the on-off valve 23c is closed to stop the supply of the $NH_3$ gas. Further, the application of RF to the plasma electrodes 33 by the radio-frequency power supply 35 is stopped to stop the generation of plasma inside the plasma partition wall 32. As a result, the purge gas supplied constantly from the gas supply pipe 24 purges the excess $NH_3$ gas or the like inside the processing container 1.

By repeating the above cycle, the SiN film is formed on the substrate W.

In this case, preferable ranges of conditions of the film forming process are as follows. In addition, process conditions of the first film forming process S401 and the second film forming process S403 may be changed as appropriate as long as they are within the following preferable ranges. For example, the process conditions of the first film forming process S401 and the second film forming process S403 may be the same or different from each other. The first film forming process, the etching process, and the second film forming process may be repeated until a desired film formation amount or shape is obtained. When a film forming temperature is 550 degrees C. or higher, a film may be formed with a thermally-activated $NH_3$ gas without applying RF at the time of supplying the $NH_3$ gas.

Temperature: 250 to 630 degrees C.
Pressure: 0.1 to 9 Torr
Flow rate of DCS gas: 500 to 5,000 sccm
Flow rate of $NH_3$ gas: 500 to 10,000 sccm
Flow rate of $N_2$ gas: 50 to 5,000 sccm
Time period of step S501: 2 to 30 seconds Time period of step S502: 5 to 30 seconds
Time period of step S503: 5 to 60 seconds
Time period of step S504: 5 to 30 seconds
RF power: 0 to 500 W With the substrate processing apparatus 100 according to the present embodiment, it is possible to improve the property of the embedding of the SiN film in the concave structure such as a trench. That is, a conformal SiN film may be formed in the first film forming process of step S401, and the opening shape (e.g., a V-shape) in which the opening portion widens may be obtained in the etching process of step S402. As a result, it is possible to suppress the occurrence of voids when embedding the SiN film in the second film forming process of step S403, which is a subsequent process.

Further, with the substrate processing apparatus 100 according to the present embodiment, the first film forming process of step S401, the etching process of step S402, and the second film forming process of step S403 may be performed in-situ (within the same processing container 1). This makes it possible to improve productivity. In addition, it is possible to suppress the formation of a native oxide film at an interface between the SiN film formed in the first film forming process of step S401 and the SiN film formed in the second film forming process of step S403. Moreover, a configuration in which the first film forming process of step S401, the etching process of step S402, and the second film forming process of step S403 are performed ex-situ, may be employed.

In addition, according to the etching processes of the first to third examples, the etching process may be performed in the temperature range of the film forming process. That is, a film forming temperature during the first film forming process of step S401 and an etching temperature during the etching process of step S402 may be identical to each other or within a predetermined temperature range (e.g., a temperature difference between the film forming temperature and the etching temperature may be within 50 degrees C.). Further, a film forming temperature during the second film forming process of step S403 and the etching temperature during the etching process of step S402 may be identical to each other or within a predetermined temperature range (e.g., a temperature difference between the film forming temperature and the etching temperature may be within 50 degrees C.).

As a result, the temperature during the film forming process of the SiN film illustrated in FIG. 9 may be maintained constant or in the predetermined temperature range. Thus, it is possible to suppress the generation of particles due to an increase or decrease of the temperature. Further, it is possible to shorten a temperature adjustment time period from after the end of the first film forming process of step S401 to before the start of the etching process of step S402. Moreover, it is possible to shorten a temperature adjustment time period from after the end of the etching process of step S402 to before the start of the second film forming process of step S403. This makes it possible to shorten a processing time period of the entire process.

In addition, since the temperature adjustment time period between the film forming process and the etching process can be shortened, it is possible to suppress an increase in the processing time period of the entire process even if the number of repetitions of the film forming process and the etching process is increased. Moreover, by increasing the number of repetitions of the film forming process and the etching process, it is possible to further suppress the occurrence of voids when embedding the SiN film.

Although the substrate processing by the substrate processing apparatus 100 has been described above, the present disclosure is not limited to the above embodiments and the like, and various modifications and improvements may be made within the scope of the gist of the present disclosure set forth in the claims.

As an example, the apparatus of the present disclosure may be a single-type substrate processing apparatus that processes one sheet of substrate, a batch-type substrate processing apparatus that simultaneously processes plural sheets of (e.g., four) substrates on the same plane, and a carousel-type substrate processing apparatus that processes plural sheets of (e.g., five) substrates while rotating the substrates.

The first film forming process of step S401 and the second film forming process of step S403 is not limited to those illustrated in FIG. 10, but may be film forming processes of forming other SiN films.

In addition, the etching process of step S402 is not limited to the etching processes of the first to third examples, but may be other etching process, for example, an etching process to be described later.

<Etching Process of Fourth Example>

Here, an etching process of a fourth example performed by the substrate processing apparatus 100 will be described with reference to FIG. 11. FIG. 11 is one example of a time chart illustrating the etching process of the fourth example performed by the substrate processing apparatus 100. Here, the substrate processing apparatus 100 etches a SiN film formed on the substrate W.

In the etching process of the fourth example, a HF gas is supplied as an etchant gas from the gas supply pipe 21, a $NH_3$ gas is supplied as a processing gas from the gas supply pipe 22, and a $N_2$ gas is supplied as a carrier gas from the gas supply pipe 24. In addition, the processing gas supplied from the gas supply pipe 22 is not limited to the $NH_3$ gas, but may be $H_2$, $D_2$, $ND_3$, amines, a hydrazine compound, a halogen compound, a mixed gas of hydrocarbon and an inert gas such as Ar or He, or the like. Further, in the substrate processing apparatus 100 that performs the etching process of the fourth example, the gas supply pipe 23 and the plasma generation mechanism 30 may be omitted.

In this case, preferable ranges of etching conditions of the SiN film in the etching process of the fourth example are as follows.

Temperature: 250 to 630 degrees C.
Pressure: 0.1 to 150 Torr
Flow rate of HF gas: 50 to 5,000 sccm
Flow rate of $NH_3$ gas: 50 to 10,000 sccm
Flow rate of $N_2$ gas: 50 to 5,000 sccm The etching process (step S402) in the film forming process illustrated in FIG. 9 may be performed by the etching process of the fourth example illustrated in FIG. 11. Also in this configuration, the first film forming process of step S401, the etching process of step S402, and the second film forming process of step S403 may be performed in-situ. Further, the etching process may be performed in the temperature range of the film forming process.

In addition, this application claims the priority from Japanese Patent Application No. 2020-53329 filed on Mar. 24, 2020, the disclosure of which is incorporated herein in its entirety by reference.

EXPLANATION OF REFERENCE NUMERALS

W: substrate, 100: substrate processing apparatus, 1: processing container, 2: ceiling plate, 20: gas supplier, 21 to 24: gas supply pipes, 21a to 23a: gas sources, 30: plasma generation mechanism, 44: exhaust device, 50: heating mechanism, 60: controller

What is claimed is:

1. A substrate processing method of etching a SiN film formed on a substrate, the substrate processing method comprising:
    etching the SiN film by performing a cycle multiple times, and
    wherein the cycle includes the following steps:
    supplying a HF gas as an etchant gas to the substrate;
    supplying a DCS gas to the substrate exposed to the HF gas;
    supplying the HF gas to the substrate exposed to the DCS gas; and
    supplying active species of plasma-excited NH$_3$ gas to the substrate exposed to the HF gas.

2. The substrate processing method of claim 1, wherein the supplying a HF gas as an etchant gas to the substrate includes supplying the HF gas and a NH$_3$ gas to the substrate.

3. The substrate processing method of claim 1, wherein the cycle further comprises: repeating multiple times,
    supplying the HF gas to the substrate, and
    supplying radicals of plasma-excited Ar gas to the substrate exposed to the HF gas.

4. The substrate processing method of claim 3, wherein the cycle further comprises: performing a purging process between the supplying the HF gas and the supplying the radicals of the plasma-excited Ar gas.

5. The substrate processing method of claim 1, wherein the cycle further comprises: performing a purging process between the supplying the HF gas, the supplying the DCS gas, the supplying the HF gas, and the supplying the active species of plasma-excited NH$_3$ gas.

6. A substrate processing method, comprising:
    embedding a first insulating film in a substrate in which a concave portion is formed; and
    etching the first insulating film by performing a cycle multiple times, and
    wherein the cycle includes the following steps:
    supplying a HF gas as an etchant gas to the substrate;
    supplying a DCS gas to the substrate exposed to the HF gas;
    supplying the HF gas to the substrate exposed to the DCS gas; and
    supplying active species of plasma-excited NH$_3$ gas to the substrate exposed to the HF gas.

7. The substrate processing method of claim 6, wherein a processing temperature in the etching the first insulating film is identical to a processing temperature in the embedding the first insulating film.

8. The substrate processing method of claim 7, wherein a temperature difference between the processing temperature in the etching the first insulating film and the processing temperature in the embedding a first insulating film is within 50 degrees C.

9. The substrate processing method of claim 8, further comprising:
    embedding a second insulating film in the concave portion of the substrate after the etching the first insulating film.

10. The substrate processing method of claim 9, wherein a processing temperature in the etching the first insulating film is identical to a processing temperature in the embedding the second insulating film.

11. The substrate processing method of claim 10, wherein a temperature difference between the processing temperature in the etching the first insulating film and the processing temperature in the embedding the second insulating film is within 50 degrees C.

12. The substrate processing method of claim 9, wherein a temperature difference between the processing temperature in the etching the first insulating film and the processing temperature in the embedding the second insulating film is within 50 degrees C.

13. The substrate processing method of claim 6, wherein a temperature difference between the processing temperature in the etching the first insulating film and the processing temperature in the embedding a first insulating film is within 50 degrees C.

14. The substrate processing method of claim 6, further comprising:
    embedding a second insulating film in the concave portion of the substrate after the etching the first insulating film.

* * * * *